United States Patent
Thompson

(10) Patent No.: US 7,471,154 B2
(45) Date of Patent: Dec. 30, 2008

(54) BIAS CIRCUIT FOR MAINTAINING HIGH LINEARITY AT CUTBACK POWER CONDITIONS

(75) Inventor: Philip Howard Thompson, Solon, IA (US)

(73) Assignee: Skyworks Solutions, Inc., Woburn, MA (US)

(*) Notice: Subject to any disclaimer, the term of this patent is extended or adjusted under 35 U.S.C. 154(b) by 188 days.

(21) Appl. No.: 11/501,378

(22) Filed: Aug. 8, 2006

(65) Prior Publication Data
US 2008/0036541 A1 Feb. 14, 2008

(51) Int. Cl.
H03F 3/68 (2006.01)
(52) U.S. Cl. .................................... 330/295; 330/51
(58) Field of Classification Search ................ 330/295, 330/296
See application file for complete search history.

(56) References Cited

U.S. PATENT DOCUMENTS

| | | | |
|---|---|---|---|
| 4,162,452 A | 7/1979 | Ash | |
| 4,430,732 A * | 2/1984 | Saga et al. | 370/323 |
| 4,501,018 A | 2/1985 | Shanley | |
| 5,450,044 A | 9/1995 | Hulick | |
| 5,553,319 A | 9/1996 | Tanbakuchi | |
| 5,859,869 A | 1/1999 | Sanderford | |
| 5,942,938 A | 8/1999 | Myers | |
| 6,101,224 A | 8/2000 | Lindoffi | |
| 6,130,579 A | 10/2000 | Iyer et al. | |
| 6,172,567 B1 | 1/2001 | Ueno et al. | |
| 6,194,963 B1 | 2/2001 | Camp | |
| 6,233,440 B1 | 5/2001 | Taylor | |
| 6,300,835 B1 * | 10/2001 | Seely et al. | 330/277 |
| 6,300,837 B1 | 10/2001 | Sowlati et al. | |
| 6,333,677 B1 | 12/2001 | Dening | |
| 6,445,247 B1 | 9/2002 | Walker | |
| 6,492,875 B2 | 12/2002 | Luo et al. | |
| 6,496,061 B1 | 12/2002 | Bloom et al. | |
| 6,510,309 B1 | 1/2003 | Thompson et al. | |
| 6,651,021 B2 | 11/2003 | Underbrink et al. | |
| 6,681,101 B1 | 1/2004 | Eidson et al. | |

(Continued)

FOREIGN PATENT DOCUMENTS

EP 0597653 5/1994

(Continued)

OTHER PUBLICATIONS

"Working Both Ways", Electronics & Wireless World, Dec. 1986, No. 1610, 1 page.

*Primary Examiner*—Benny Lee
*Assistant Examiner*—Alan Wong
(74) *Attorney, Agent, or Firm*—Weide & Miller, Ltd.

(57) ABSTRACT

To improve operation during cutback power mode by reducing gain expansion, sections of a multi-section amplifier are selectively biased. During cutback power condition, fewer than all sections of the multi-section amplifier are biased. Selective biasing reduces power consumption and obtains desired output power. To reduce gain expansion, a bias resistor is provided between one or more sections to establish a small or leakage bias current into non-enabled or non-biased sections. This leakage bias current weakly biases the non-enabled sections allowing small signal amplification by the non-enabled sections. The combined amplification of the enabled section and the weakly biased section provide greater initial gain at lower power input signal levels thereby reducing gain expansion.

20 Claims, 9 Drawing Sheets

U.S. PATENT DOCUMENTS

| | | |
|---|---|---|
| 6,763,228 B2 | 7/2004 | Prentice |
| 6,771,128 B1 | 8/2004 | Yamashita et al. |
| 6,819,182 B2 | 11/2004 | Sibrai |
| 6,853,250 B2 * | 2/2005 | Bachhuber et al. .......... 330/285 |
| 6,873,208 B2 | 3/2005 | Shinjo et al. |
| 6,873,211 B1 | 3/2005 | Thompson et al. |
| 6,970,040 B1 * | 11/2005 | Dening ...................... 330/126 |
| 6,996,191 B1 | 2/2006 | Meditz |
| 7,295,065 B2 * | 11/2007 | Shah et al. .............. 330/124 R |
| 2004/0142674 A1 | 7/2004 | Kuiri |

FOREIGN PATENT DOCUMENTS

| | | |
|---|---|---|
| EP | 0624004 | 11/1994 |
| EP | 0800267 | 8/1997 |
| GB | 2235855 | 3/1991 |
| JP | 57069939 | 4/1982 |
| WO | WO 96 17431 | 6/1996 |
| WO | WO 02/078170 | 10/2002 |

* cited by examiner

BIAS CIRCUIT FOR MAINTAINING HIGH LINEARITY AT CUTBACK POWER CONDITIONS

FIELD OF THE INVENTION

The invention relates to power amplifiers and in particular a method and apparatus for maintaining linearity in cutback power conditions.

RELATED ART

Numerous electronic devices utilize power amplifiers to increase the magnitude of an electrical signal for transmission of the signal via an antenna or other medium. Wireless devices, which are often battery powered, are designed to minimize power consumption. Likewise, wireless devices often operate under a particular standard or specification in unison with other wireless devices and one or more base stations. As such, it is important for the wireless device to operate within accurate tolerances and maintain accurate signal reproduction, particularly with regard to output power and linearity.

In general, power amplifiers in wireless devices typically operate at power levels significantly lower than their saturated output (max) power condition. This condition is commonly referred to as the cutback power condition. This may be done to reduce power consumption, maintain operation in a desired output power range, or both. At these power levels, the efficiency of the power amplifier is essentially determined by the quiescent current (bias current with no RF applied). It is therefore desirable to provide a mode of operation corresponding to reduced quiescent current for the cutback condition.

One such solution is to simply reduce the quiescent collector current which is accomplished by reducing the base bias in a bipolar transistor amplifier. While a reduced quiescent current mode of operation is a well known technique, there is a fundamental trade-off between reducing the quiescent current for a given transistor area and the linearity or gain flatness of the resulting amplifier. In general, for an amplifier with a design optimized for operation near its saturated output power, "leaning out" the bias will reduce the current density within the transistor which will result in a characteristic referred to as gain expansion where the output power of the amplifier increases at a rate greater than the increase in input power. Gain expansion is a type of non linear distortion that is generally undesirable because an amplifier with excessive gain expansion tends to have poor inter-modulation, Adjacent Channel Power Ratio (ACPR), and Error Vector Magnitude (EVM) performance. Inter-modulation, ACPR, and EVM are common figures of merit used to measure the linearity of an amplifier used in wireless communication.

One proposed possible solution is to reduce the area of the transistor by physically "switching out" a portion of the transistor cells that typically comprise a power amplifier output stage. This technique reduces the quiescent current and the transistor area at the same time so as to not reduce the current density of the transistor amplifier thereby not resulting in gain expansion. In order to completely "switch out" these cells, they must be isolated at DC and at the RF frequency of operation. It is however, extremely difficult to realize an effective RF switch that does not add undesirable parasitic losses or degrade the linearity of the amplifier. If only the DC path of these cells are isolated, the RF signal will still excite the "switched out" cells at some power level and result in the undesired gain expansion mentioned above. As a result, this proposed solution does not fully provide a workable circuit architecture to address the problem.

As a result, there is a need for a bias circuit that provides a means of disabling or significantly reducing the DC bias to a portion of the amplifier cells when the amplifier cells comprise an output stage for low power or cutback power modes of operation. Any such proposed solution should minimize the gain expansion effect that is typically associated with reduced quiescent current operation. The circuit needs to have minimal parasitic loss and should not degrade the linearity of the amplifier.

SUMMARY

Disclosed herein is a method and apparatus that overcomes the drawbacks of the prior art by providing an amplifier system which may operate in full or maximum power mode while still managing operation at cut back power. Gain expansion is reduced thereby maintaining amplifier performance.

To improve operation during cutback power mode by reducing gain expansion, sections of a multi-section amplifier are selectively biased. During cutback power condition, fewer than all sections of the multi-section amplifier are biased. Selective biasing reduces power consumption and obtains desired output power. To reduce gain expansion, a bias resistor is provided between one or more sections to establish a small or leakage bias current into non-enabled or non-biased sections. This leakage bias current weakly biases the non-enabled sections allowing small amplification by the non-enabled sections. The combined amplification of the enabled section and the weakly biased section provide greater initial gain at lower power input signal levels thereby reducing gain expansion. At higher power levels, the bias current of the non-enabled sections is limited by the bias resistor since increased current flow through the bias resistor will result in increased voltage drop across the bias resistor which in turn reduces the bias voltage applied to the non-enabled cells.

In one embodiment, a method for amplifying an input signal while minimizing gain expansion is disclosed wherein the amplifier comprises at least a first section and a second section with the outputs of the first and second sections connected to a common output. In this method during a high power condition the amplifier receives a bias signal from a bias node of the first section and the second section and receives an input signal to the first section and the second section. The amplifier then amplifies the input signal with the first section and the second section to create an amplified signal at the common output.

During a cutback power condition the amplifier receives a bias signal from a bias node at only the first section or the second section, such that a portion of the bias signal flows through a resistor, interconnecting the first section and the second section, to the section which is not otherwise provided a bias signal. The amplifier receives the input signal to the first section and the second section and then amplifies the input signal with either the first section or the second section to create an amplified signal at the common output.

In one embodiment, the bias signal is provided by a voltage source. It is also contemplated that the first section and the second section may comprise one or more transistors. During cutback power condition, the portion of the bias signal that flows through the resistor weakly biases the section that does not receive a bias signal from a bias node, which in turn reduces gain expansion. As discussed herein, cutback power condition comprises operation with reduced quiescent current. This method may also comprise receiving a control signal and responsive to the control signal, providing a bias signal from a bias node to only one of the first section or the second section.

Also disclosed herein is an amplifier having at least a first section and a second section comprising in combination an input configured to receive an input signal and a first bias node configured to selectively receive a first bias signal. Also part of the amplifier is a second bias node configured to selectively receive a second bias signal. The amplifier also includes a common output configured to combine the amplified signals of the first section and the second section. As discussed below in more detail, the amplifier further comprises a first amplifier section configured to receive the input signal, selectively receive the first bias signal, and provide an amplified input signal to the output. Likewise, the amplifier also includes a second amplifier section configured to receive the input signal, selectively receive the second bias signal, and provide an amplified input signal to the output. To reduce gain expansion, this embodiment also includes a bias resistor connecting the first amplifier stage and the second amplifier stage.

In one embodiment, during a first mode of operation, the first amplifier stage is connected to the first bias node and the second amplifier stage is not connected to the second bias node. During a second mode of operation, the first amplifier stage is not connected to the first bias node and the second amplifier stage is connected to the second bias node. During a third mode of operation, the first amplifier stage is connected to the first bias node and the second amplifier stage is connected to the second bias node. For example, during the first mode of operation and the second mode of operation current flows through the bias resistor to the amplifier stage that is not connected to a bias node.

The configuration described above may further comprise one or more DC blocking capacitors. Moreover, this configuration may further comprise additional amplifier sections and additional biasing resistors. A bias circuit comprised of current mirrors may be configured to selectively bias the first bias node and the second bias node.

Also disclosed herein is a method of reducing gain expansion when amplifying a signal during cutback power mode. In one embodiment the method comprises providing an input signal to an amplifier such that the amplifier comprises at least a first section and a second section, and then selectively providing a bias signal to a first bias node or a second bias node to thereby bias either the first section or the second section to create a biased section and a non-biased section. Thereafter, the method, from the circuit configuration, provides a leakage bias signal to the non-biased section from the biased section through a bias resistor network to thereby weakly bias the non-biased section. Then, this method amplifies the signal with the first section and the second section, either of which is weakly biased, to create an amplified signal. The resulting amplified signal is provided on an amplifier output.

In one embodiment, first section and the second section comprise one or more transistors. It is contemplated that the first section and the second section may have a different number of transistors or cells. In addition, the method may also include generating at least one control signal, such as with a processor or controller. The control signal may determine bias connections or selectively provides a bias signal to a first bias node, a second bias node or both. In one embodiment, the leakage bias signal flows through a resistor that is connected between a base node of the first section and a base node of the second section. In one configuration, the bias node of the unbiased section is floating. More than one bias node may be utilized.

Other systems, methods, features and advantages of the invention will be or will become apparent to one with skill in the art upon examination of the following figures and detailed description. The features and elements described herein may be enabled in any combination or individually. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

To overcome the drawback of the prior art and to provide additional benefits as disclosed herein, a power amplifier is disclosed wherein during cutback power condition a small amount of base current flows to sections of the output stage that are deselected to thereby weakly bias these transistor cells. As discussed below in more detail, this configuration and method of operation prevents or reduces gain expansion while not adversely affecting other aspects of operation.

Figure 1:
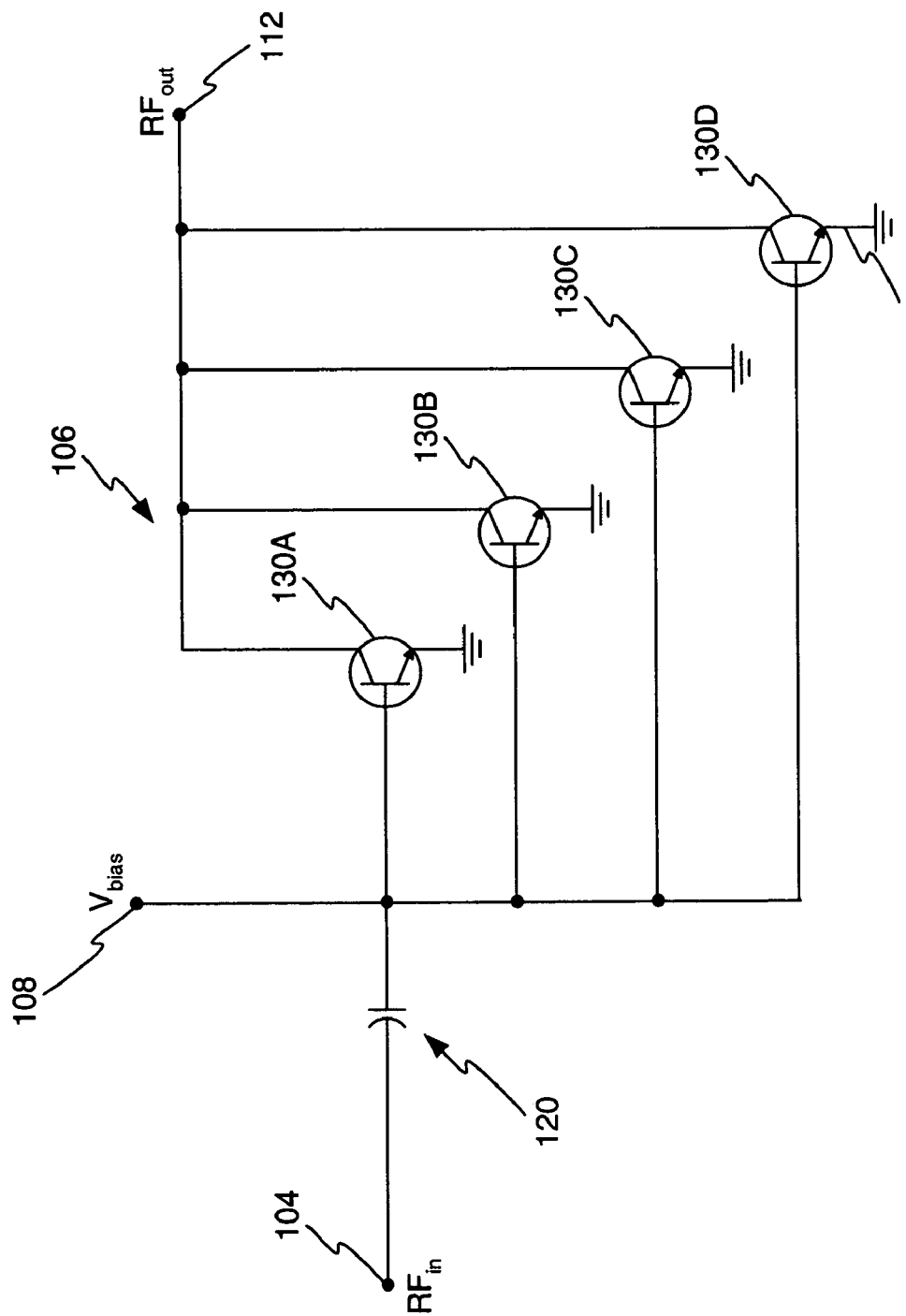
FIG. 1 illustrates a single prior art power amplifier output stage which suffers from gain expansion at reduced quiescent current conditions.

FIG. 1 illustrates a single prior art power amplifier output stage 100 which suffers from gain expansion. In this example prior art amplifier stage, an RF input 104 is configured to receive an input signal to be amplified by the output stage 106. The input 104 connect to a capacitor 120, of which the opposing side connects to a bias node 108 shown as $V_{bias}$. The bias node 108 connects to the base of transistor cells or sections 130A-130D. In this embodiment the transistor cells 130 comprise NPN type devices. The emitters of cells 130 connect to ground 116 as shown while the collectors are tied to a common output 112, labeled as $RF_{out}$.

In general in prior art embodiments a power amplifier output stage may be partitioned into two or more sections, each section 130 containing an arbitrary number of transistor cells. For example, four sections 130 are shown in FIG. 1. The sections 130 may or may not contain equal numbers of transistor cells. The collectors of all cells in all sections 130 are connected together at a main collector node which serves as the RF output node 112 of the amplifier stage. The emitters of all cells in all sections 130 are likewise connected together and tied to a common ground node 116 thereby creating a common emitter amplifier stage. The bases of all cells within a section 130 are tied together at a common base node as shown. In this example, there are 4 sections of the array, each containing 25 individual cells. The input capacitor that couples the RF signal to the base of the output stage is also shown.

Figure 2:
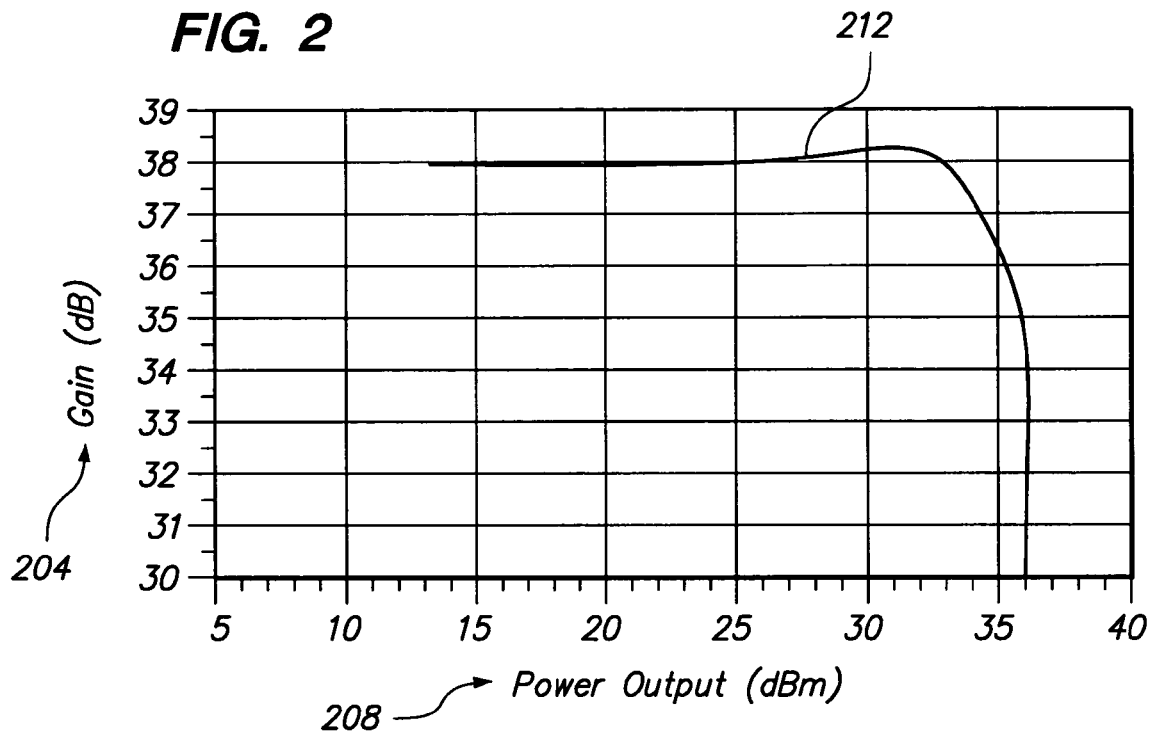
FIG. 2 illustrates an example plot of gain as related to power output in a "normal" or high quiescent current bias state.

As a characteristic to this configuration of an output stage, gain expansion does not occur when quiescent current is optimized for operation near saturation, but gain expansion does occur during operation with reduced quiescent current. FIG. 2 illustrates an example plot of power output as related to gain. As shown, the vertical axis 204 represents gain in dB while the horizontal axis 208 represents output power in dB milliwatts. A signal plot 212 shows the gain verses power characteristic for a three stage amplifier employing an output transistor stage shown in FIG. 1 with quiescent current optimized for operation near saturated output power. In this example configuration, this comprises 191.2 mA. As can be seen from the plot 212 of FIG. 2, gain expansion is less than a few tenths of a dB.

Figure 3:
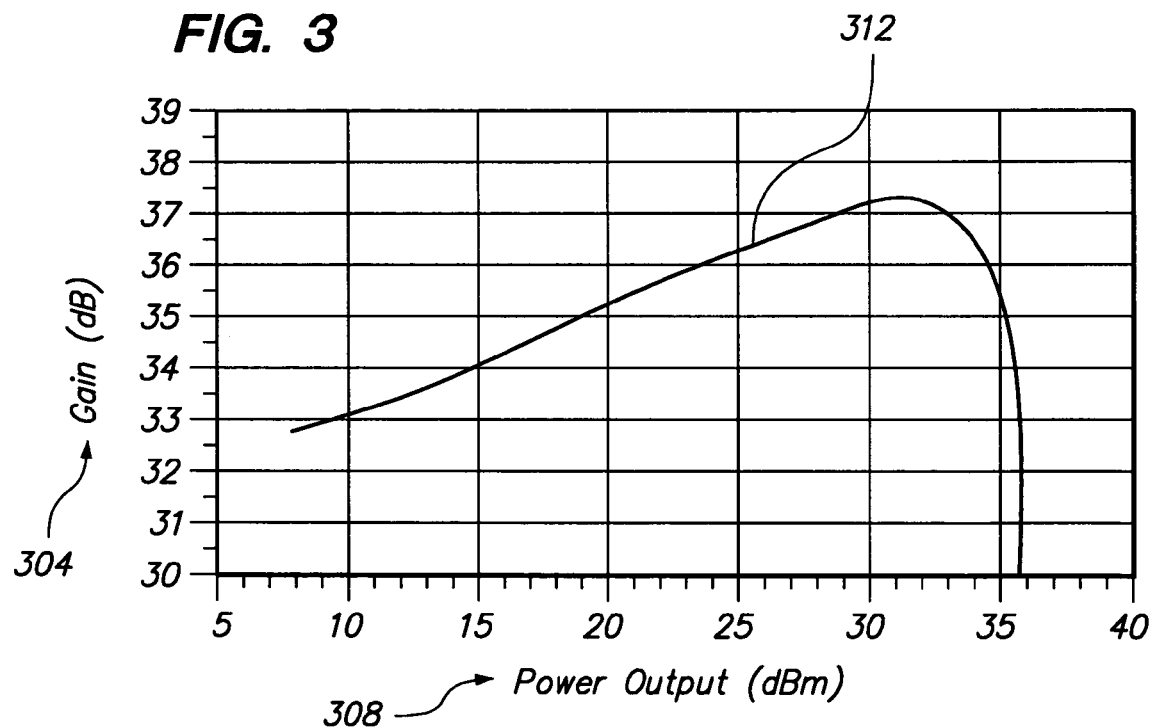
FIG. 3 illustrates an example plot of gain verses power for the same amplifier as used to generate the plot of FIG. 2, but with reduced quiescent current in the output stage.

FIG. 3 illustrates a signal plot of gain verses power for the same amplifier as used to generate the plot of FIG. 2, but with reduced quiescent current in the output stage. In this example plot 312 quiescent current was reduced by a factor of 4. In FIG. 3, the vertical axis 304 represents gain in dB while the horizontal axis 308 represents output power in dB milliwatts. Total gain expansion of 4.5 dB is evident and gain expansion in the back-off region is 3.2 dB (in this example the back-off region refers to power levels between 10 and 25 dBm). Quiescent current savings compared to high power mode is 144 mA, however, the gain expansion is undesirable.

Figure 4:
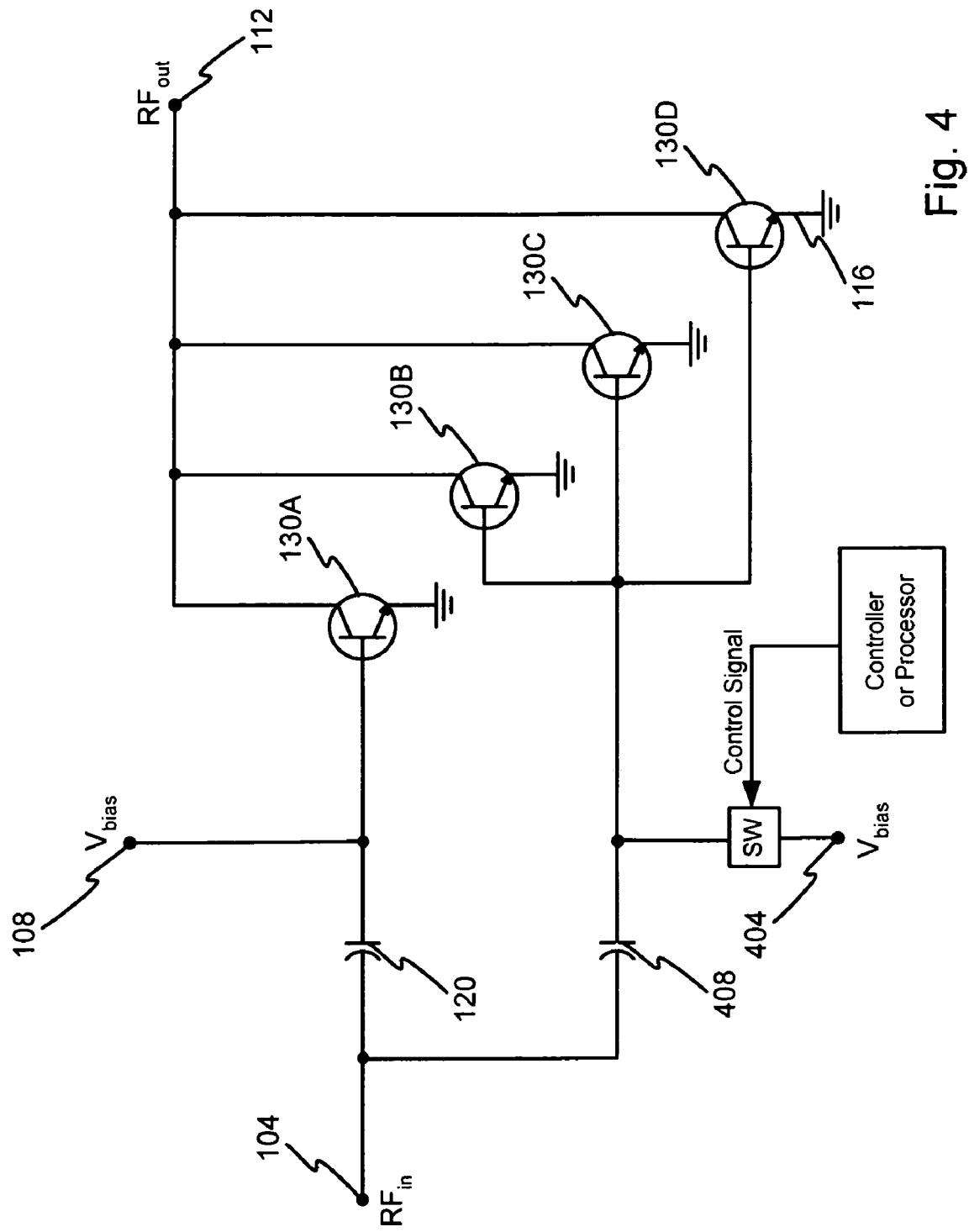
FIG. 4 illustrates an example circuit having divided sections within an amplifier output stage.

To overcome these drawbacks in the prior art, the circuit configuration shown in FIG. 4 may be adopted. FIG. 4 illustrates an example circuit having divided sections within an amplifier output stage. As compared to FIG. 1, identical elements are labeled with identical reference numbers. Focusing on the differences in FIG. 4 as compared to FIG. 1, the input node 104 branches to not only capacitor 120 but also capacitor 408. The opposing end of capacitor 408 connects to a second bias node 404. The base of sections 130A connect to bias node 108 while the base of sections 130B-130D connect to bias node 404.

Bias node 108 and bias node 404 may be selectively energized such that both, or only one of the bias nodes is energized at a time. This allows the bias of ¼ of the transistor cells to be isolated or operated independently from the other ¾ of the transistor cells in the output array. The input capacitors 120, 408 have been partitioned and provided to provide the necessary DC isolation from the input. As an advantage to this embodiment the reduced gain expansion is evidence of the improvement. For numerous reasons this is an improvement including because the bias of the cells can be DC isolated.

Figure 5:
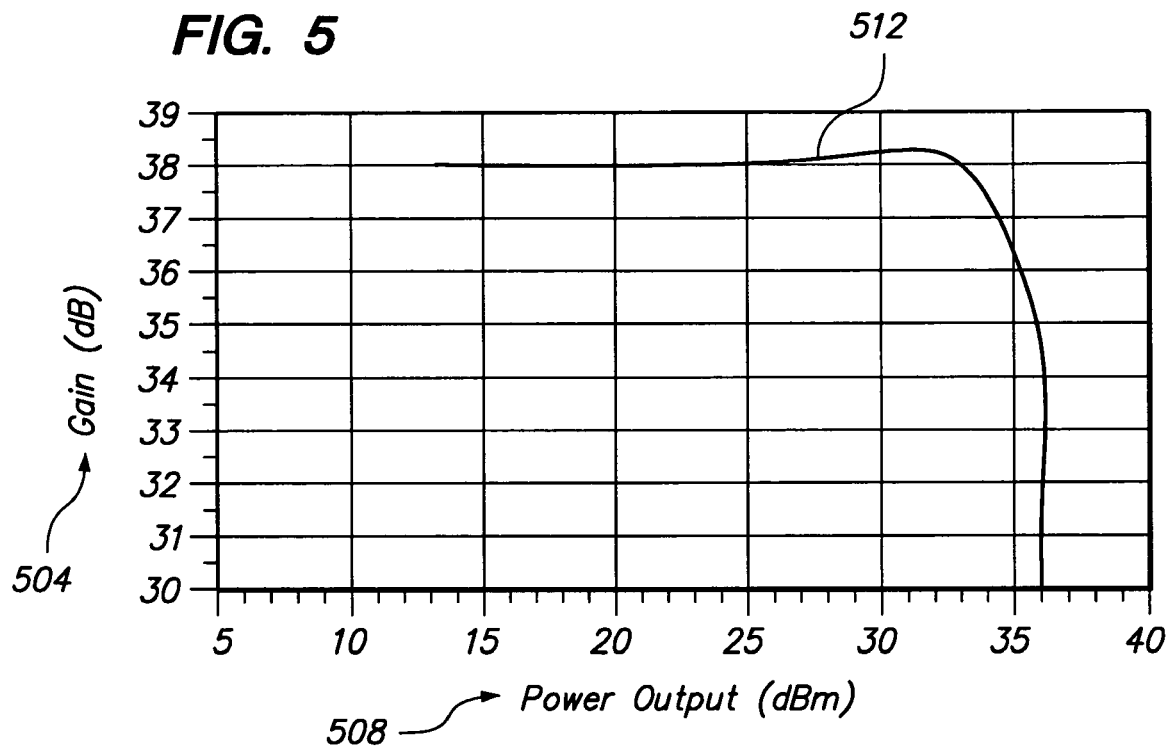
FIG. 5 illustrates an example plot of gain verses power characteristic for the amplifier with the output transistor stage shown in FIG. 4 with both DC ports biased at the same level.

FIG. 5 illustrates a signal plot 512 of gain verses power characteristic for the amplifier having the output transistor stage shown in FIG. 4 with both DC ports biased at the same level. In this plot, the vertical axis 504 represent gain in dB while the horizontal axis 508 represents output power in dB milliwatts. Because bias nodes 108 and 404 are biased at the same level, the results are comparable to those shown in FIG. 2.

Figure 6:
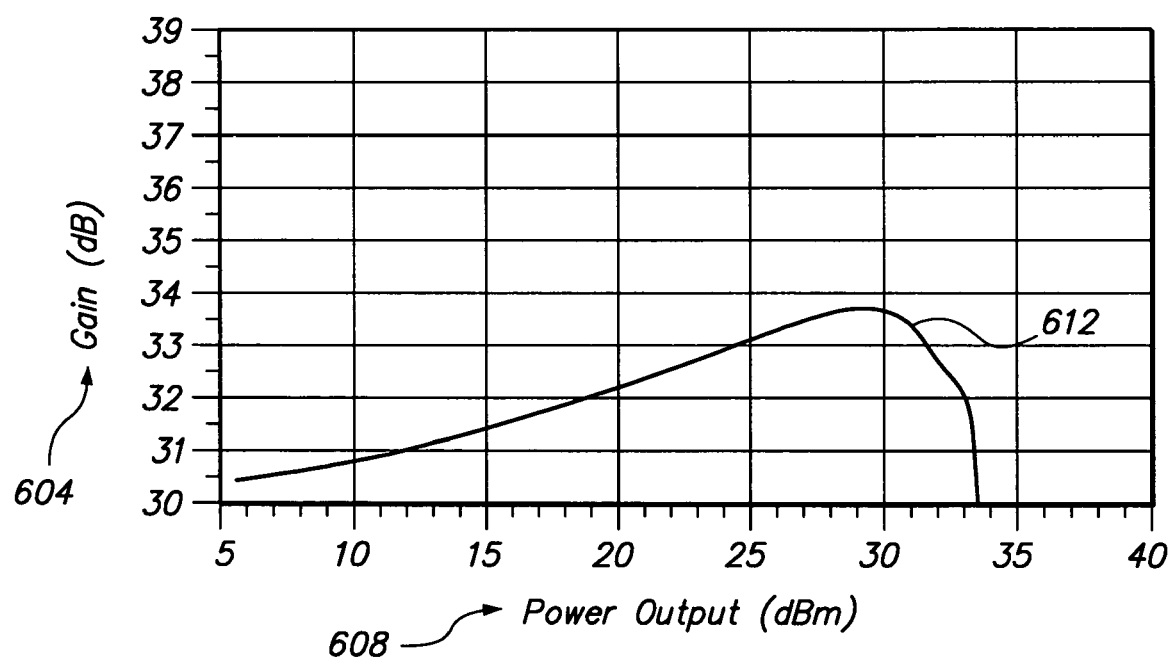
FIG. 6 illustrates a signal plot gain verses power characteristic for the amplifier configuration having the output transistor stage shown in FIG. 4 but with only the ¼ cell DC port biased and the ¾ cell Vbias node floating.

In contrast, FIG. 6 illustrates a signal plot 612 of gain verses power characteristic for the amplifier configuration having the output transistor stage shown in FIG. 4 but with only the ¼ cell DC port biased, namely bias node 108 is on while bias node 404 is off. Hence, in this example, the other ¾ cell's base connection is open circuited. In this plot, the vertical axis 504 represent gain in dB while the horizontal axis 508 represents output power in dB milliwatts.

Note there is less total gain expansion (3.2 verses 4.5 dB) and in the back-off region (2.2 vs 3.2 dB) as compared to the signal plot shown in FIG. 3. This level of gain expansion is an improvement over the configuration of FIG. 1, buy may be considered unacceptably high for certain specifications. Also note that the saturated output power is reduced, but this is acceptable since the reduced bias mode corresponds to lower output power operation. Quiescent current reduction compared to high power mode is 142 mA in this example configuration.

Figure 7:
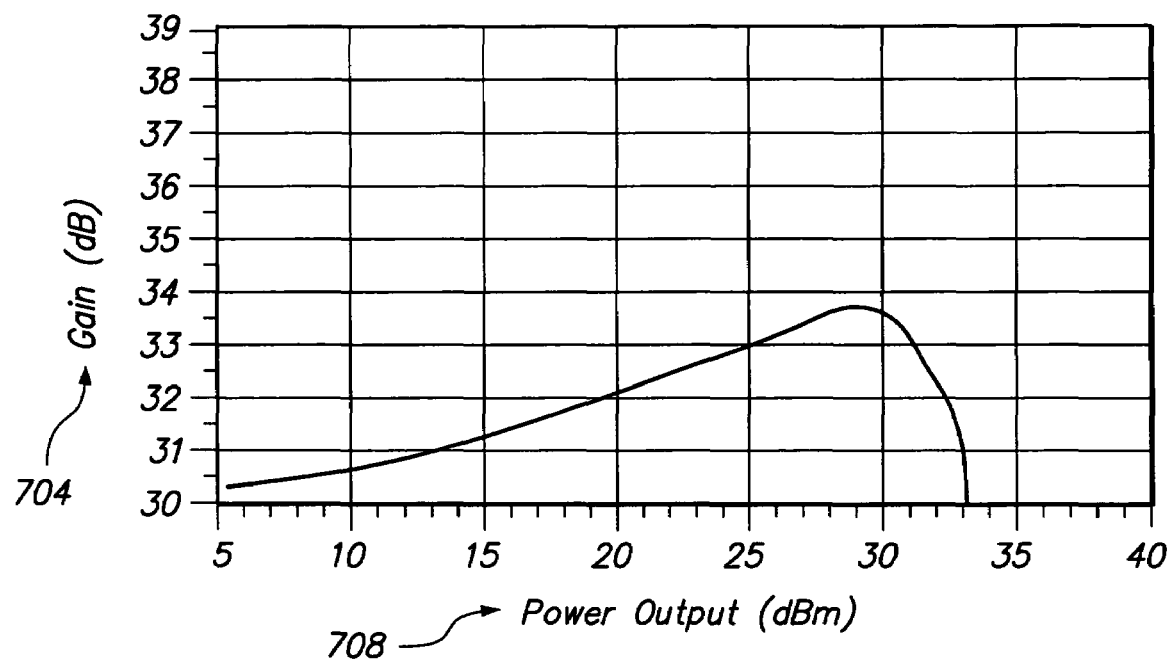
FIG. 7 illustrates a signal plot generated by the circuit of FIG. 4, except the ¾ cell's base connection is tied to ground.

FIG. 7 illustrates a signal plot 712 which is also generated by the circuit of FIG. 4, except the ¾ cell's base connection is tied to ground. In this plot, the vertical axis 704 represent gain in dB while the horizontal axis 708 represents output power in dB milliwatts. Similar total gain expansion (3.4 dB) and back-off gain expansion (2.4 dB) is present as compare to FIG. 6. Quiescent current reduction compared to high power mode is also 142 mA.

Figure 8:
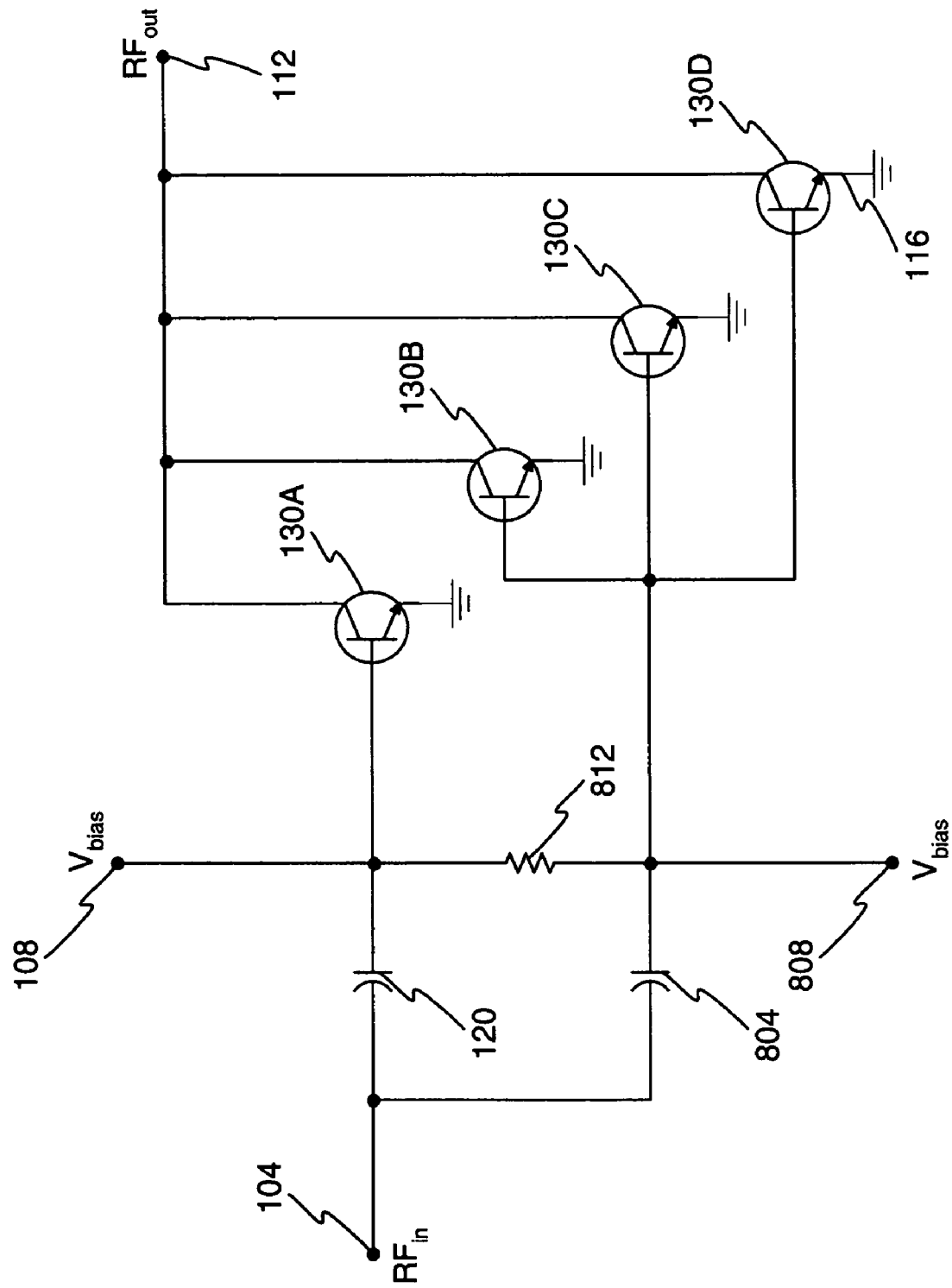
FIG. 8 illustrates an example output stage configuration having a bias resistor included to reduce gain expansion.

FIG. 8 illustrates an example output stage configuration having a bias resistor 812 included to reduce gain expansion. As compared to FIG. 4, identical elements are labeled with identical reference numbers. It is contemplated that additional circuitry or elements, in addition to that shown, may be provided and included in FIG. 8. Focusing on the aspects of FIG. 8 which differ from FIGS. 1 and 4, a bias node 808 connects to sections 130B-130D and to DC blocking capacitor 804. A resistor 812 connects bias nodes 108 and 808. A number of series capacitors equal to the number of sections are used to couple an RF signal into the base nodes of each section. The resistor 812 is added between the base nodes of each section.

The resistor 812 allows a very small amount of base current to flow in the section of the output stage that is deselected, so that the transistor cells in that section are weakly biased on. The resistance 812 is of a sufficiently high value as to limit the base current that is allowed to feed into the deselected transistor cells which in turn limits the gain expansion of this portion of the amplifier. The remaining (selected) section of the amplifier operates in a normal fashion where the quiescent current is equal to the quiescent current used in a conventional amplifier scaled by the ratio of cells in that section to the total number of cells.

Stated another way, this resistor 812 allows the section that does not have bias applied in the cutback mode to draw a small amount of bias current through the resistor from the section that does have bias applied. This small amount of bias current helps to reduce variation in amplifier performance with respect to input impedance and small signal gain, but the resistor 812 prevents the non biased section from causing gain expansion as the RF signal increases. One or more switches (not shown) may be utilized to selectively enable one or more sections, such as for example by enabling voltage on the nodes 108 or 808. A controller, processor, or other device may selectively control the switches or other means for selectively enabling the one or more sections.

When both sections of the output stage are selected, the amplifier operates as a typical device. The resistor 812 placed between the base nodes 108, 808 of the two sections has no effect on circuit operation since both base nodes are at the same potential and thus no current flows through the resistor. It is contemplated that in other embodiments the bias nodes 108, 808 may be established at different levels to establish any manner of output gain and gain compression curves that are desired.

Figure 9:
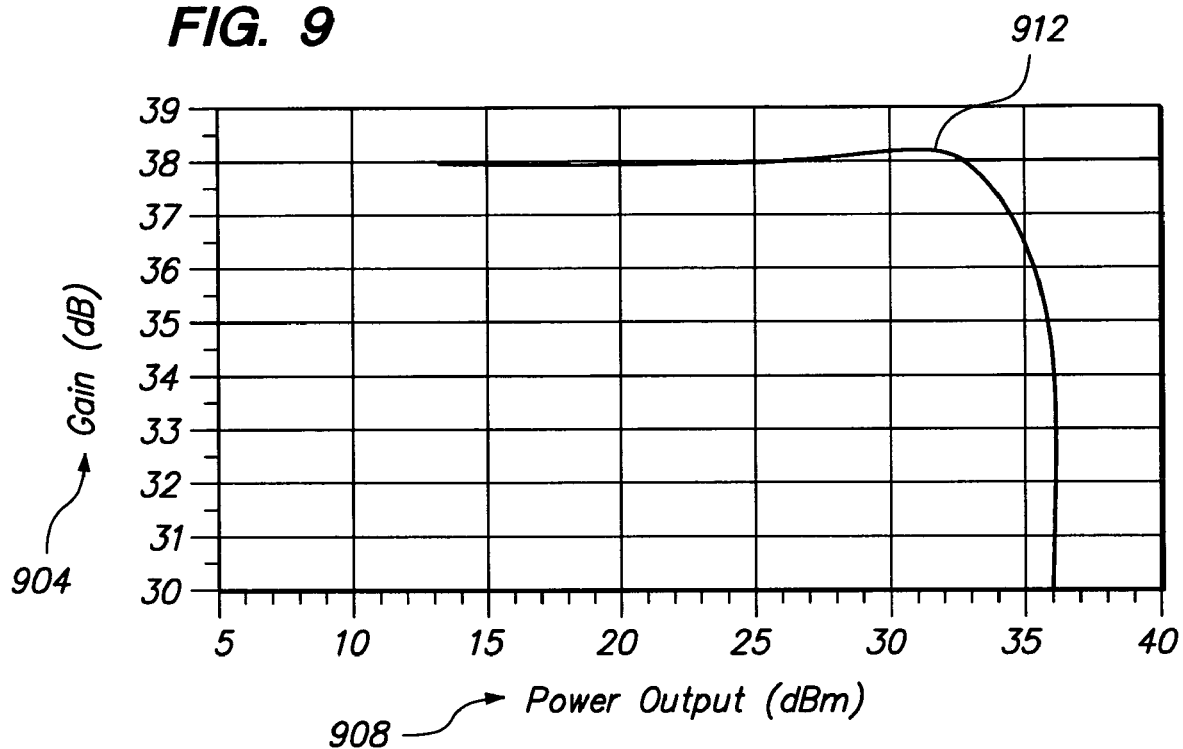
FIG. 9 illustrates a signal plot showing the gain verses power characteristic for the amplifier with the output transistor stage shown in FIG. 8.
Figure 10:
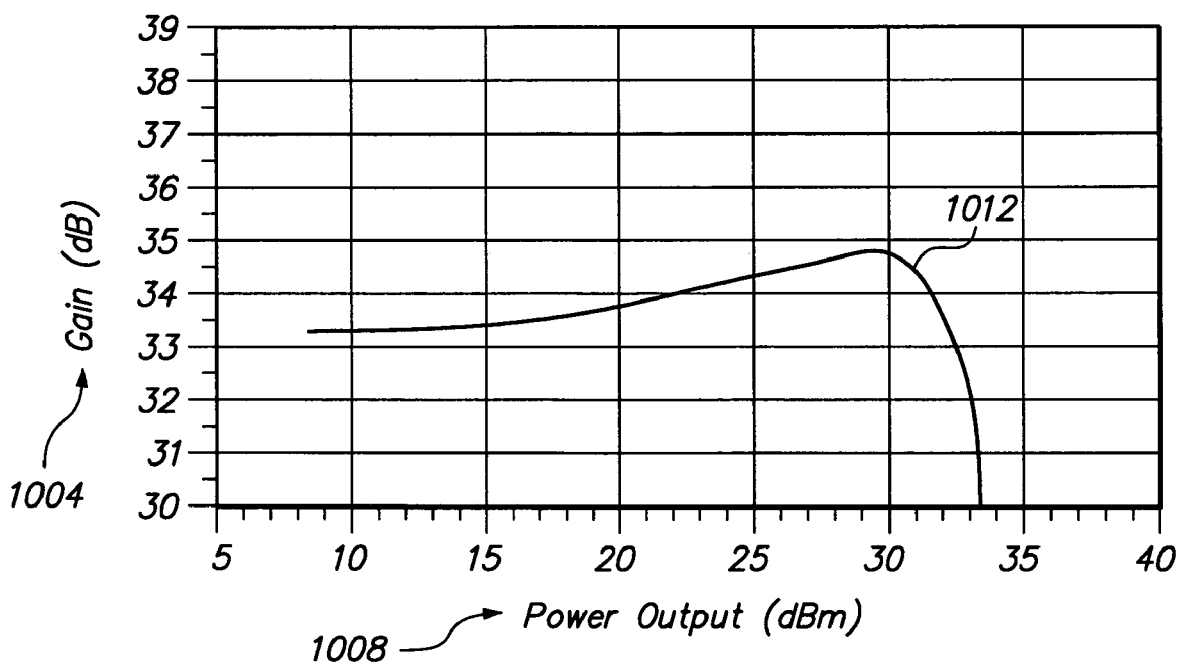
FIG. 10 illustrates a signal plot of the gain verses power characteristic for the amplifier with the output transistor stage shown in FIG. 8 with only the ¼ cell DC port biased.
Figure 11:
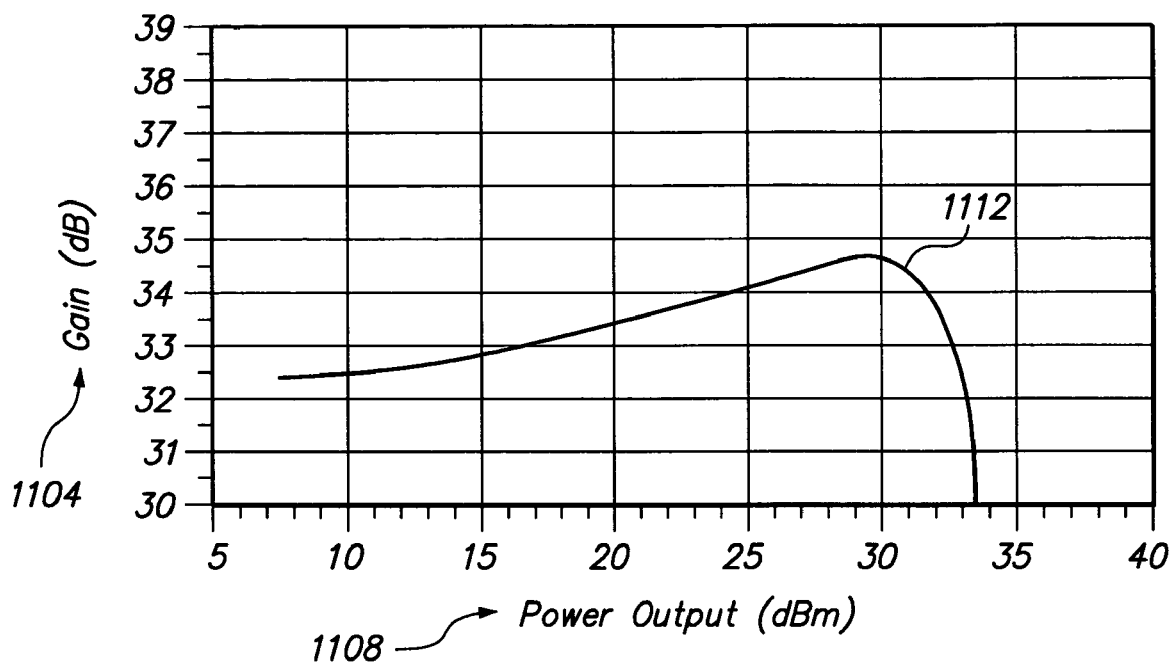
FIG. 11 illustrates a signal plot as shown in FIG. 10 except the bias point for the ¼ cell has been reduced.

The following signal plots shown in FIGS. 9, 10, and 11 illustrate the advantages of this configuration over other approaches. For these example plots, which are discussed below, the "back off" region is defined as power levels between 10 and 25 dBm which is roughly 10 dB lower than the saturated output power in the high power mode.

FIG. 9 illustrates an example plot 912 showing the gain verses power characteristic for the amplifier with the output transistor stage shown in FIG. 8. In this plot, the vertical axis 904 represent gain in dB while the horizontal axis 908 represents output power in dB milliwatts. In this plot, both bias nodes are established or biased at the same level. The results are comparable to those shown in FIG. 2 because the effect of the resistor is negated due the identical potential on each resistor terminal. This indicates that the configuration shown in FIG. 8 does not degrade the performance of the amplifier when operated at high power levels near the saturated output power.

FIG. 10 illustrates an example plot 1012 of the gain verses power characteristic for an amplifier having the output transistor stage shown in FIG. 8 with only the ¼ cell DC port biased, i.e. on. In this plot, the vertical axis 1004 represents gain in dB while the horizontal axis 1008 represents output power in dB milliwatts. This example plot 1012 shows significantly less total gain expansion (1.5 dB) and back-off gain expansion (1 dB) as compared to FIGS. 3, 6, and 7. However, quiescent current is 21 mA higher than the low bias modes of FIGS. 6 and 7 due to the base current that is allowed to leak into the "unbiased" ¾ cell through the added resistor. Quiescent current reduction compared to high power mode is 120 mA, which although slightly less than the embodiments of FIGS. 1 and 4, is offset in benefit by the improvement in gain expansion.

FIG. 11 illustrates an example plot 1112 of a signal from the same circuit and conditions as shown in FIG. 10 except the bias point for the ¼ cell has been reduced such that the reduction in current relative to the high power mode is 136 mA for a more direct comparison of quiescent current verses gain expansion. In FIG. 11, the vertical axis 1104 represent gain in dB while the horizontal axis 1108 represents output power in dB milliwatts. As can be seen in FIG. 11, the total gain expansion is now only 2.2 dB compared to 3.2 and 3.4 dB for FIGS. 6 and 7 respectively. As a further benefit, back-off gain expansion is only 1.6 dB compared to 2.2 and 2.4 dB for FIGS. 6 and 7 respectively. As shown in these figures, the configuration of FIG. 8 provides normal operation during saturation or high power condition, while providing the benefit of reduced gain expansion at comparable low quiescent current conditions, such as during cutback power condition.

Figure 12:
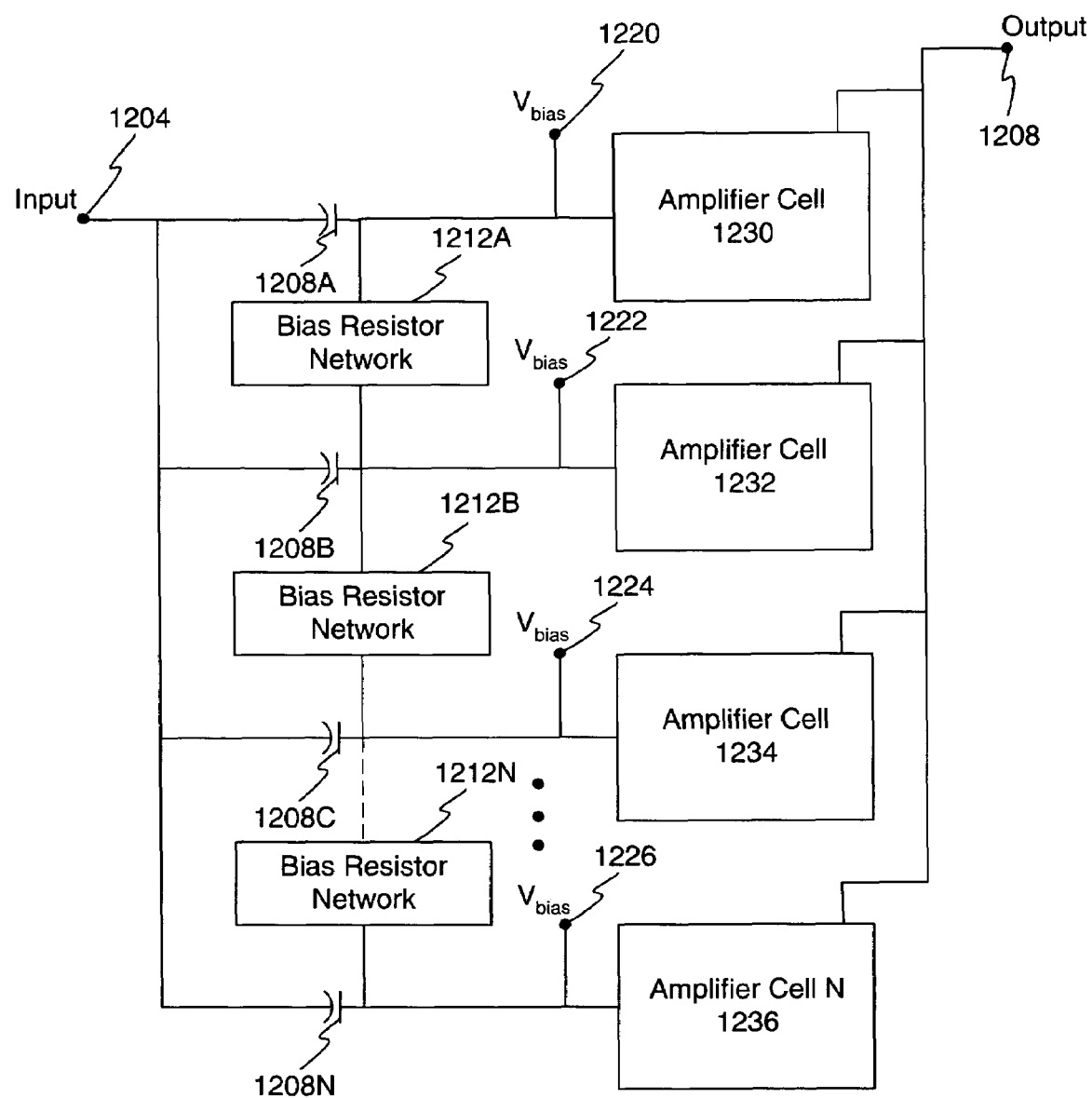
FIG. 12 illustrates a block diagram of a generalized example embodiment of the amplifier as disclosed herein.

FIG. 12 illustrates a block diagram of a generalized example embodiment of the amplifier as disclosed herein. In this example embodiment an input 1204 is configured to receive an input signal to be amplified. The input 1204 connects to DC blocking capacitors 1208A-1208N, where N may comprise any whole number. The opposing terminal of the capacitor 1208 connects to a bias resistor network 1212A-1212N as shown and to a bias node 1220, 1222, 1224, 1226. Each of the bias resistor networks 1212A-1212N may be configured identically or differently. The bias resistor networks 1212A-1212N may comprise any configuration capable of isolating voltage from the bias nodes 1220, 1222, 1224, 1226 to the other amplifier cells to achieve operation as described above. The bias resistor networks 1212A-1212N may comprise any elements including but not limited resistors, capacitors, inductors, control logic, other semiconductor devices, or combinations of the above. The bias resistor networks 1212 may interconnect in any manner as would be understood in the art or to achieve the benefits as set forth herein. For example, network 1212N may connect in some fashion to network 1212A.

The bias nodes 1220, 1222, 1224, 1226 may be selectively enabled or turned on/off to selectively provide a bias signal to its respective node. Any means may be utilized to enable a bias signal on a node 1220, 1222, 1224, 1226 including but not limited to switches or controlled bias circuits.

An amplifier cell 1230 connects to bias node 1220 and bias resistor network 1212A. An amplifier cell 1232 connects to bias node 1222 and bias resistor networks 1212A, 1212B. An amplifier cell 1234 connects to bias node 1224 and bias resistor networks 1212B, 1212N. An amplifier cell 1236 connects to bias node 1226 and bias resistor network 1212N. As discussed above, the network 1212N may also connect to network 1212A. The output of each amplifier cell 1230, 1232, 1234, 1236 connects to a common output 1208.

Operation occurs as described above such that the $V_{bias}$ nodes 1220, 1222, 1224, 1226 may be selectively enabled. During operation, some of the current from the enabled (on) cells associated with the enabled bias nodes will leak into the non-enabled cells thereby reducing gain expansion. The signal provided to the input is amplified as desired by the cells 1230-1236 and provided on the output 1208.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A method for amplifying an input signal while minimizing gain expansion, the amplifier comprising at least a first section and a second section, the method comprising:
   during a high power condition:
      providing a bias signal from a bias node of the first section and the second section;
      providing an input signal to the first section and the second section;
      amplifying the input signal with the first section and the second section to create an amplified signal;
      providing the amplified signal on an output;
   during a cutback power condition:
      providing the bias signal from the bias node to only one of the first section or the second section, wherein a portion of the bias signal flows through a resistor interconnecting the first section and the second section to the section which is not otherwise provided the bias signal;
      providing an input signal to the first section and the second section;
      amplifying the input signal with either the first section or the second section to create an amplified signal; and
      providing the amplified signal on the output.

2. The method of claim 1, wherein the bias signal is provided by a voltage source.

3. The method of claim 1, wherein the first section and the second section comprise one or more transistors.

4. The method of claim 1, wherein during cutback power condition, the portion of the bias signal that flows through the resistor weakly biases the section that does not receive the bias signal from the bias node.

5. The method of claim 1, wherein cutback power condition comprises operation with reduced quiescent current.

6. The method of claim 1, further comprising receiving a control signal and responsive to the control signal, providing the bias signal from the bias node to only one of the first section or the second section.

7. An amplifier having at least a first section and a second section comprising:
   an input configured to receive an input signal;
   a first bias node configured to selectively receive a first bias signal;
   a second bias node configured to selectively receive a second bias signal;
   an output configured to carry an output of the amplifier, the amplifier further comprising:
     a first amplifier section configured to:
       receive the input signal;
       selectively receive the first bias signal; and
       provide an amplified input signal to the output;
     a second amplifier section configured to:
       receive the input signal;
       selectively receive the second bias signal; and
       provide an amplified input signal to the output;
   a bias resistor network connecting the first amplifier stage and the second amplifier stage.

8. The amplifier of claim 7, wherein:
   during a first mode of operation the first bias node is enabled thereby enabling the first amplifier stage and the second bias node is not enabled thereby disabling the second amplifier stage;
   during a second mode of operation, the first bias node is not enabled thereby disabling the first amplifier stage and the second bias node is enabled thereby enabling the second amplifier stage; and
   during a third mode of operation, the first bias node and the second bias node are enabled thereby enabling the first amplifier stage and the second amplifier stage.

9. The amplifier of claim 8, wherein during the first mode of operation and the second mode of operation current flows through the bias resistor network to an amplifier stage that is not enabled.

10. The amplifier of claim 7, wherein the first and second amplifier sections are comprised of a different number of transistors.

11. The amplifier of claim 7, further comprising one or more blocking capacitors.

12. The amplifier of claim 7, further comprising additional amplifier sections and additional biasing resistors.

13. The amplifier of claim 7, further comprising a controller or processor configured to selectively bias the first bias node and the second bias node.

14. A method of reducing gain expansion when amplifying a signal during cutback power mode, the method comprising:
   providing an input signal to an amplifier, the amplifier comprising at least a first section and a second section;
   selectively providing a bias signal to a first bias node or a second bias node to thereby bias either the first section or the second section to create a biased section and a non-biased section;
   providing a leakage bias signal to the non-biased section from the biased section through a bias resistor network to thereby weakly bias the non-biased section;
   amplifying the signal with the first section and the second section, either of which is weakly biased, to create an amplified signal; and
   providing the amplified signal on an amplifier output.

15. The method of claim 14, wherein the first section and the second section comprise one or more transistors.

16. The method of claim 14, wherein the first section and the second section comprise a different number of cells.

17. The method of claim 14, further comprising generating at least one control signal which selectively provides a bias signal to a first bias node or a second bias node or both.

18. The method of claim 14, wherein the leakage bias signal flows through a resistor that is connected between a base node of the first section and a base node of the second section.

19. The method of claim 14, wherein the bias node of the unbiased section is floating.

20. The method of claim 14, wherein a first bias signal is provided to the first section and a second bias signal is provided to the second section and the first bias node and the second bias node are provided at different bias nodes.

* * * * *